(12) United States Patent
Deshpande et al.

(10) Patent No.: US 11,205,716 B2
(45) Date of Patent: Dec. 21, 2021

(54) METHOD FOR FORMING A HETEROJUNCTION BIPOLAR TRANSISTOR AND A HETEROJUNCTION BIPOLAR TRANSISTOR DEVICE

(71) Applicant: IMEC VZW, Leuven (BE)

(72) Inventors: Veeresh Vidyadhar Deshpande, Leuven (BE); Bertrand Parvais, Nil-Saint-Vincent (BE)

(73) Assignee: IMEC VZW, Leuven (BE)

(*) Notice: Subject to any disclaimer, the term of this patent is extended or adjusted under 35 U.S.C. 154(b) by 155 days.

(21) Appl. No.: 16/662,671

(22) Filed: Oct. 24, 2019

(65) Prior Publication Data

US 2020/0203509 A1 Jun. 25, 2020

(30) Foreign Application Priority Data

Dec. 21, 2018 (EP) .................................. 18215592

(51) Int. Cl.
*H01L 29/737* (2006.01)
*H01L 29/08* (2006.01)
*H01L 29/10* (2006.01)
*H01L 29/267* (2006.01)
*H01L 29/66* (2006.01)

(52) U.S. Cl.
CPC ........ *H01L 29/737* (2013.01); *H01L 29/0817* (2013.01); *H01L 29/0821* (2013.01); *H01L 29/1004* (2013.01); *H01L 29/267* (2013.01); *H01L 29/66318* (2013.01)

(58) Field of Classification Search
CPC ............. H01L 29/0821; H01L 29/0826; H01L 29/0804–0839; H01L 29/1004; H01L 29/1008; H01L 29/41708; H01L 29/66227–66962; H01L 29/73–7378; H01L 2924/1305–13056
See application file for complete search history.

(56) References Cited

U.S. PATENT DOCUMENTS

| | | |
|---|---|---|
| 6,780,695 B1 | 8/2004 | Chen et al. |
| 2008/0203490 A1 | 8/2008 | Feilchenfeld et al. |
| 2011/0049568 A1 | 3/2011 | Lochtefeld et al. |

(Continued)

FOREIGN PATENT DOCUMENTS

WO 2018/063319 A1 4/2018

OTHER PUBLICATIONS

European Search Report, European Patent Application No. 18215592.9, dated Jul. 4, 2019, 8 pages.

*Primary Examiner* — Eric A. Ward
(74) *Attorney, Agent, or Firm* — McDonnell Boehnen Hulbert & Berghoff LLP (57) ABSTRACT

A method for forming a heterojunction bipolar transistor is provided. The method includes (a) forming a doped region in a group IV semiconductor layer of a substrate; (b) forming an epitaxially grown III-V semiconductor body on a surface portion of the doped region, the body extending from the surface portion and protruding vertically above the doped region, wherein the doped region and the body forms a first sub-collector part and a second sub-collector part, respectively; and (c) forming an epitaxially grown III-V semiconductor layer stack on the body, the layer stack comprising a collector, a base and an emitter. There is further provided a heterojunction bipolar transistor device.

8 Claims, 7 Drawing Sheets

(56) References Cited

U.S. PATENT DOCUMENTS

| | | | |
|---|---|---|---|
| 2011/0266595 A1* | 11/2011 | Hata | H01L 21/02551 |
| | | | 257/190 |
| 2012/0061730 A1 | 3/2012 | Yamanaka et al. | |
| 2014/0054646 A1 | 2/2014 | Vellianitis | |
| 2015/0311911 A1 | 10/2015 | Cheng et al. | |
| 2016/0372582 A1* | 12/2016 | Camillo-Castillo | ........................ |
| | | | H01L 29/0821 |
| 2017/0012125 A1 | 1/2017 | Le et al. | |
| 2017/0359030 A1* | 12/2017 | Obu | H01L 29/66242 |

* cited by examiner

METHOD FOR FORMING A HETEROJUNCTION BIPOLAR TRANSISTOR AND A HETEROJUNCTION BIPOLAR TRANSISTOR DEVICE

CROSS-REFERENCE TO RELATED APPLICATIONS

The present application is a non-provisional patent application claiming priority to European Patent Application No. 18215592.9, filed Dec. 21, 2018, the contents of which are hereby incorporated by reference.

FIELD OF THE DISCLOSURE

The present inventive concept relates to a method for forming a heterojunction bipolar transistor and also to a heterojunction bipolar transistor device.

BACKGROUND

A heterojunction bipolar transistor (HBT) is a type of transistor which uses both electron and hole charge carriers. HBTs made of III-V semiconductor materials are generally used as devices for radio-frequency (RF) and other applications where high power amplification is desired.

A challenging aspect with III-V HBTs resides in combining them with group IV-based devices (which are formed on group IV semiconductor substrates). As an example, in various applications, such as RF applications, III-V HBTs need to be combined with silicon-based logic devices. A current solution is a multi-chip package where the III-V HBTs and the silicon-based devices are fabricated on separate III-V and silicon substrates, respectively, which subsequently are transferred to a common substrate or combined by chip stacking. However, multi-chip package fabrication requires additional fabrication steps which may increase overall complexity and costs.

SUMMARY OF THE DISCLOSURE

There is hence a need for a novel approach for integrating III-V based HBTs on a group IV semiconductor substrate. An objective of the present disclosure is to address this need. It is a further objective of the present disclosure to provide an III-V HBT device and fabrication method with improved compatibility with a complementary metal-oxide-semiconductor (CMOS) front-end.

According to a first aspect of the present disclosure, a method is provided for forming a heterojunction bipolar transistor, the method comprising:

forming a doped region in a group IV semiconductor layer of a substrate;

forming an epitaxially grown III-V semiconductor body on a surface portion of the doped region, the body extending from the surface portion and protruding vertically above the doped region, wherein the doped region and the body forms a first sub-collector part and a second sub-collector part, respectively; and forming an epitaxially grown III-V semiconductor layer stack on the body, the layer stack comprising a collector, a base and an emitter.

According to a second aspect of the present disclosure, a heterojunction bipolar transistor device is provided. The heterojunction bipolar transistor device comprises:

a substrate comprising a group IV semiconductor layer having a doped region;

an epitaxial III-V semiconductor body formed on a surface portion of the doped region, the body extending from the surface portion and protruding vertically above the doped region, wherein the doped region and the body forms a first sub-collector part and a second sub-collector part, respectively; and an epitaxial III-V semiconductor layer stack formed on the body, the layer stack comprising a collector, a base and an emitter.

The disclosure provides an improved approach for integrating a group III-V based HBT (hereinafter III-V HBT) on a group IV semiconductor substrate. For instance, the approach enables hetero-integration of III-V HBTs and group IV CMOS devices on a single substrate or wafer, thereby allowing improved performance and reduced costs.

In some aspects, the sub-collector comprises a group IV sub-collector part (i.e. formed by the doped region) and a group III-V sub-collector part (i.e. formed by the III-V body). This approach provides a number of advantages as discussed below.

A prior art III-V HBT may be of a greater height than a typical CMOS front end and a considerable contribution to the total height may come from the sub-collector. According to the presently disclosed design of the sub-collector, a total height of the HBT device above the substrate may, however, be reduced since a part of the effective length of the sub-collector may be accommodated within the doped region of the substrate. In other words, a portion of a HBT height may be embedded in the group IV semiconductor layer of the substrate with a reduced portion of the HBT height remains above the group IV layer of the substrate.

The reduced height of the HBT above the substrate may in turn facilitate co-integration of the III-V HBTs with CMOS technology. More specifically, a reduced topography variation between a CMOS region and the HBT device may be achieved. Use of a same back end of line (BEOL) interconnect structure is accordingly facilitated, notably without requiring adaption of the CMOS front end or III-V growth in deep-etched recesses in the substrate which otherwise could tend to complicate fabrication.

Furthermore, considerably greater doping levels may be achieved in group IV layers compared to III-V materials. Hence, a group IV sub-collector part can enable a reduced sub-collector contact resistance. Additionally, by locating the interface between the (first) group IV sub-collector part and the (second) group III-V sub-collector part specifically to the sub-collector can enable a barrier-less heterojunction. In comparison, forming the entire sub-collector in the group IV semiconductor layer could result in increased resistance at the heterojunction between the sub-collector and the lower doped collector.

The surface portion of the doped region may be exposed by an aperture extending through an insulating layer formed on the doped region. Thereby, the III-V body may be grown selectively on the surface portion of the doped region while masking other surface portions of the doped region.

The method may further comprise forming a sub-collector contact in contact with a surface of a contact sub-region of the doped region, horizontally spaced apart from the surface portion of the doped region. The first sub-collector part may accordingly comprise a horizontally extending portion disposed between the contact sub-region and the second sub-collector part (of the III-V body).

The doped region may comprise a semiconductor fin, the fin having an upper surface defining an upper surface of the doped region, and the method may further comprise:

embedding the semiconductor fin in the insulating layer;

opening the insulating layer to expose the upper surface of the fin, thereby forming an upper portion of the aperture; and etching back the upper surface of the fin, thereby forming a lower portion of the aperture and an etched back surface portion of the doped region, wherein the body is formed on the etched back surface portion of the doped region. Accordingly, the HBT may be conveniently implemented on a group IV substrate comprising semiconductor fins, which may have been formed on the substrate e.g. for the purpose of supporting CMOS finFET devices. By etching back the upper surface of the semiconductor fin prior to forming the III-V body, an overall height of the HBT device structure may be reduced, compared to forming the III-V body on a non-etched back upper fin surface.

Moreover, the lateral dimensions of the lower portion of the aperture may be defined based on the dimensions of the fin. Meanwhile, the lateral dimensions of the upper portion of the aperture may be designed independently from the lower portion, e.g. by definition of an etch mask on the insulating layer, to be used to during the opening of the insulating layer.

The semiconductor fin may form a high aspect ratio structure (i.e. a vertical height greater than a width). Accordingly, the lower portion of the aperture may be formed as a high aspect ratio aperture. This may allow a lower portion of the III-V body to be grown using aspect ratio trapping (ART). The ART technique allows trapping of dislocations originating from differences in lattice constant of the III-V semiconductor material and the group IV semiconductor.

The upper portion of the aperture may be formed with a greater width than a width of the lower portion of the aperture. Accordingly, forming the III-V body may comprise epitaxially growing a lower portion of the body in the lower portion of the aperture and an upper portion of the body in the upper portion of the aperture, and wherein the upper portion of the aperture is wider than the lower portion of the aperture.

The epitaxial growth of the III-V semiconductor body may hence initiate on the surface portion of the doped region of the substrate in the lower portion of the aperture. The epitaxial growth may then continue in the lower portion of the aperture and afterwards in the upper portions of the aperture. Combined with forming the lower portion of the aperture with a high aspect ratio, the upper portion of the body may be formed with a reduced density of dislocations and a greater horizontal extension, compared to the lower portion of the body.

The doped region may further comprise a second semiconductor fin (i.e. of the group IV semiconductor, advantageously silicon) horizontally spaced apart from the fin, and the method may further comprise forming a sub-collector contact in contact with an upper surface of the second fin. The second semiconductor fin may thus form a contact-sub-region, conveniently accessible by the sub-collector contact from above. The second semiconductor fin can additionally enable a further extension of the sub-collector length. More specifically, the first part of the sub-collector may comprise a vertical portion extending vertically through the second fin and a horizontal portion extending horizontally from the second fin to the etched back surface portion of the doped region, i.e. to the III-V body.

A dopant dose of the doped region (i.e. and thus of the first sub-collector part) may be in a range from 5E18 to 1E20 atoms/cm$^3$. The dopant dose of the III-V semiconductor body, i.e., the second sub-collector part, may be at least 1E17 atoms/cm$^3$. These dopant doses may result in an HBT with favorable electrical performance, and especially a low sub-collector resistance.

The second sub-collector, the collector, the base, and the emitter may comprise III-V compound semiconductors such as gallium arsenide (GaAs), indium gallium phosphide (InGaP), indium phosphide (InP), indium gallium arsenide (InGaAs), or gallium arsenide phosphide (GaAsP).

The HBT device of the second aspect may comprise a sub-collector contact arranged in contact with a surface of a contact sub-region of the doped region, horizontally spaced apart from the surface portion of the doped region.

The HBT device may comprise an insulating layer arranged on the doped region, wherein an aperture is formed in the insulating layer above the surface portion, the aperture comprising a lower portion and an upper portion wider than the lower portion, and wherein the body comprises a lower portion formed in the lower portion of the aperture and an upper portion formed in the upper portion of the aperture, and wherein the upper portion of the body has a width greater than a width of the lower portion of the body.

The doped region of the HBT device may comprise a semiconductor fin horizontally spaced apart from the III-V body, and a sub-collector contact arranged in contact with an upper surface of the semiconductor fin.

BRIEF DESCRIPTION OF THE FIGURES

The above, as well as additional objects, features and advantages of the present disclosure, will be better understood through the following illustrative and non-limiting detailed description, with reference to the appended drawings. In the drawings like reference numerals will be used for like elements unless stated otherwise.

DETAILED DESCRIPTION OF THE DISCLOSURE

Figures 1, 2:
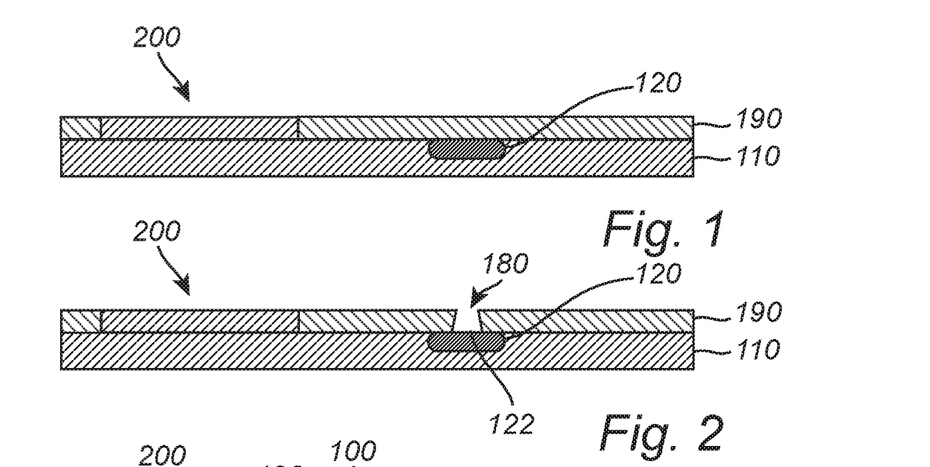
FIG. 1 illustrates a first method for forming an HBT device and shows schematically an insulating layer 190 formed to cover the semiconductor substrate 110 in areas surrounding the doped region 120.
FIG. 2 illustrates a first method for forming an HBT device and shows a surface portion 122 of the doped region 120 exposed by forming an aperture 180 extending through the insulating layer 190.
Figures 3, 4:
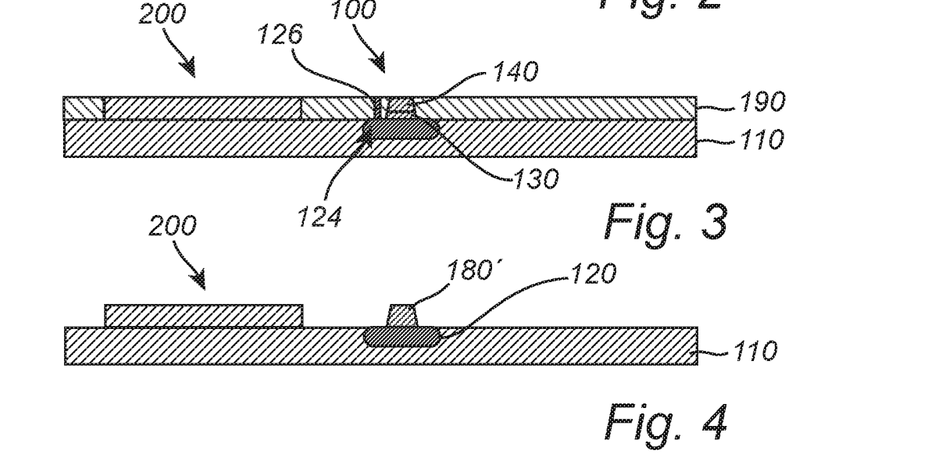
FIG. 3 illustrates a first method for forming an HBT device and shows formation of an epitaxially grown III-V semiconductor body 130 on the surface portion 122 of the doped region 120.
FIG. 4 illustrates a variation of the first method and shows a sacrificial body 180' formed on the surface portion of the doped region 120 where the III-V body 130 is to be formed.

A first method for forming an HBT device will now be disclosed with reference to FIGS. 1-3. FIG. 1 shows schematically a substrate comprising a group IV semiconductor layer, which in the following will be depicted as a single uniform structure and referred to as a semiconductor substrate 110. However, it should be noted that multi-layered substrate types also are possible such as semiconductor-on-insulator substrates. The semiconductor substrate 110 (i.e. the group IV semiconductor layer) may typically be silicon however other group IV semiconductors are also possible such as germanium or silicon-germanium.

The method comprises forming a doped region 120 in (the group IV semiconductor layer of) the semiconductor substrate 110. The doped region 120 forms a group IV sub-collector part, or shorter a first sub-collector part. The doped region 120 may be formed by ion implantation or diffusion doping. The dopants are usually n-type dopants. The doped region 120 may be formed with a dopant dose ranging from 5E18 to 1E20 at/cm$^3$. The doped region may be formed in an un-doped region of the semiconductor substrate 110 or in a well-region doped with an opposite dopant type (e.g., a p-well in the case of an n-type doped region 120).

An insulating layer 190 has further been formed on the doped region 120 to cover the same. The insulating layer 190 may be of a single- or multi-layered composition. The one or more layers of the insulating layer 190 may be of an oxide, such as silicon oxide, or a dielectric material, such as a low-k dielectric. The insulating layer 190 may be deposited using any suitable conventional deposition process, such as chemical vapor deposition (CVD). As shown in FIG. 1, the insulating layer 190 may be formed to cover the semiconductor substrate 110 in areas surrounding the doped region 120.

In FIG. 2, a surface portion 122 of the doped region 120 has been exposed by forming an aperture 180 extending through the insulating layer 190. The aperture 180 may be formed by etching the insulating layer through an opening defined in an etch mask (not shown), for instance a photoresist etch mask. Any conventional wet or dry etching process suitable for etching the insulating layer 190 may be used. Although the aperture 180 is shown to be of a tapered shape in FIG. 2, this is purely an illustrative and non-limiting example.

Subsequent to forming the aperture 180 the method proceeds with forming an epitaxially grown III-V semiconductor body 130 on the surface portion 122 of the doped region 120, as shown in FIG. 3. The III-V body 130 forms a III-V sub-collector part, or shorter a second sub-collector part. The III-V body 130 extends from the surface portion 122 and protrudes vertically above the doped region 120. The insulating layer 190 allows the III-V body 130 to be selectively deposited on the surface portion 122 by masking the doped region 120 in surface portions outside of the aperture 180.

The method proceeds by forming an epitaxially grown III-V semiconductor layer stack 140 on the III-V body 130. The layer stack may be formed by epitaxially growing, in sequence, a collector, a base and an emitter.

Each one of the III-V body 130 and the layers of the layer stack 140, i.e. the collector, the base and the emitter may be formed of III-V materials, and provided with a dopant dose, appropriate for their respective functions in the HBT device. The III-V materials may be grown by metal-organic CVD (MOCVD), but molecular beam epitaxy (MBE) may also be possible. The dopants may be introduced through implantation doping and/or in-situ doping during the epitaxy. The III-V body 130 may be formed of GaAs or GaInP and doped with an n-type dopant dose of at least 1E17 at/cm$^3$. The collector may be formed of GaAs or GaInP or a combination of GaAs and GaInP, and doped with an n-type dopant dose of 1E16 at/cm$^3$ or less. The base may be formed of GaAs or InGaAs and doped with a p-type dopant dose of 5E18 to 1E20 at/cm$^3$. The emitter may be a single- or multi-layered structure comprising for instance GaInP, GaAs and InGaAs, and doped with an n-type dopant dose of 1E19 to 1E20 at/cm$^3$. The above presented material examples are applicable to forming an n-p-n HBT. However, it is also possible to form a p-n-p HBT wherein the dopant types of the doped-region 120, the III-V body 130 and the layers of the III-V layer stack 140 would be reversed (i.e. any reference to p-type dopant may be replaced with an n-type dopant, and vice versa).

In FIG. 3, the layer stack 140 is depicted in a highly schematic manner. However, as would be appreciated by a skilled person the layers may be formed with different horizontal/lateral dimensions. In particular, the emitter layer(s) may be formed with a smaller footprint than the base layer, usually at a horizontal mid-position of the base layer, such that the base layer comprises a pair of laterally protruding base layer portions on mutually opposite sides of the emitter. The pair of laterally protruding base layer portions may allow contacting by a pair of base contacts, as will be further discussed below.

Accordingly, a semiconductor structure for an HBT has been formed on the substrate 110, the semiconductor structure comprising the doped region 120, the III-V body 130 and the layer stack 140. The method may proceed with contact formation to complete the HBT device. A sub-collector contact 126 may be formed in contact with a contact sub-region 124 of the doped region 120, horizontally spaced apart from the III-V body 130. The contact sub-region 124 may be defined by etching a contact aperture in the insulating layer 190, the contact aperture exposing a surface portion of the contact sub-region 124. The sub-collector contact 126 may thereafter be formed in the contact aperture. The sub-collector contact 126 may be formed by depositing one or more metals in the aperture, in contact with the surface portion of the contact sub-region 124. In a similar fashion, a pair of base contacts may be formed in contact with the base and an emitter contact may be formed in contact with (a top layer of) the emitter.

The above process steps may as shown in FIGS. 1-3 be performed adjacent to a CMOS front end 200 formed in another area of the substrate 110. The CMOS front end 200 may comprise active devices, such as field-effect transistors (FETs), formed using state of the art CMOS processing. As indicated in the figures, the HBT device and the CMOS front end protrude with similar a height above a main surface of the substrate 110. This may facilitate subsequent BEOL processing, such as forming of an interconnect structure which may be shared by the HBT device and the CMOS front end. The similar heights of the HBT device and the CMOS front end is enabled at least in part by the design of the sub-collector which comprises a group IV sub-collector part and a group IV sub-collector part, wherein the group IV sub-collector part is formed in the substrate 110.

Although in the above, reference has been made to a single HBT semiconductor structure it should be noted that any desired number of HBT semiconductor structures may be formed on the substrate 110. Accordingly, a plurality of doped regions may be formed in the substrate 110 and a respective III-V body and III-V layer stack may be formed on each doped region. Moreover, there need not necessarily be a one-to-one correspondence between the doped region(s) and the III-V body and III-V layer stack. I.e. two or more III-V body and III-V layer stacks may be formed on each contact region wherein the contact region may form a group IV sub-collector part for each III-V body and III-V layer stack formed thereon.

Figure 5:
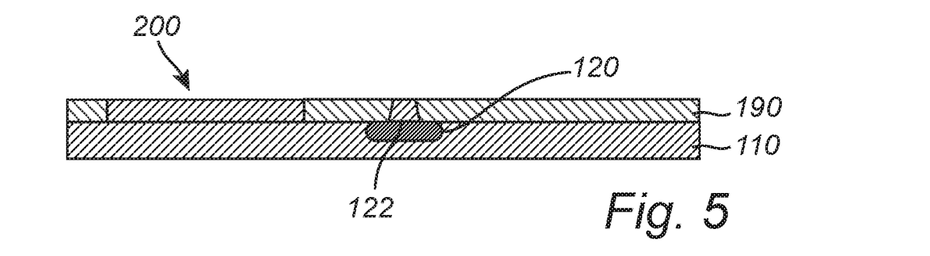
FIG. 5 illustrates a variation of the first method and shows the sacrificial body 180' embedded in the insulating layer 190.
Figure 6:
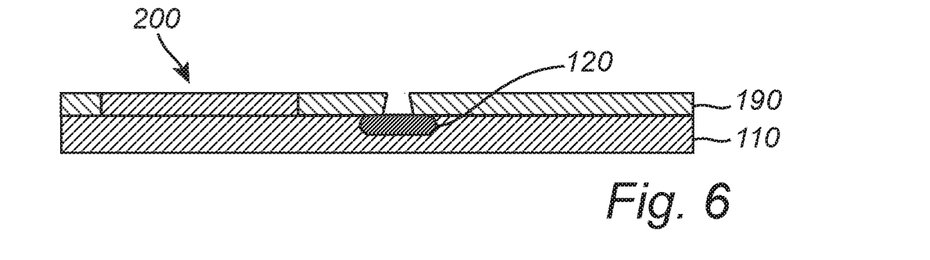
FIG. 6 illustrates a variation of the first method and shows the aperture 180 is thereafter formed by removing the sacrificial body 180' by etching the sacrificial body 180' selectively until the surface portion 122 is exposed.

FIGS. 4-6 illustrate a variation of the first method wherein the aperture 180 is formed in a different manner. With reference to FIG. 4, a sacrificial body 180' is formed on the surface portion of the doped region 120 where the III-V body 130 is to be formed. The sacrificial body 180' may for instance be a polysilicon or amorphous silicon body. The sacrificial body 180' may be formed by depositing a sacrificial layer on the substrate 110 and thereafter patterning the sacrificial body 180' in a lithography and etching process.

In FIG. 5, the sacrificial body 180' has been embedded in the insulating layer 190. In FIG. 6, the aperture 180 is thereafter formed by removing the sacrificial body 180' by etching the sacrificial body 180' selectively until the surface portion 122 is exposed. The method may thereafter proceed as discussed in connection with FIG. 3.

A second method for forming an HBT device will now be disclosed with reference to FIGS. 7-13.

Figure 7:
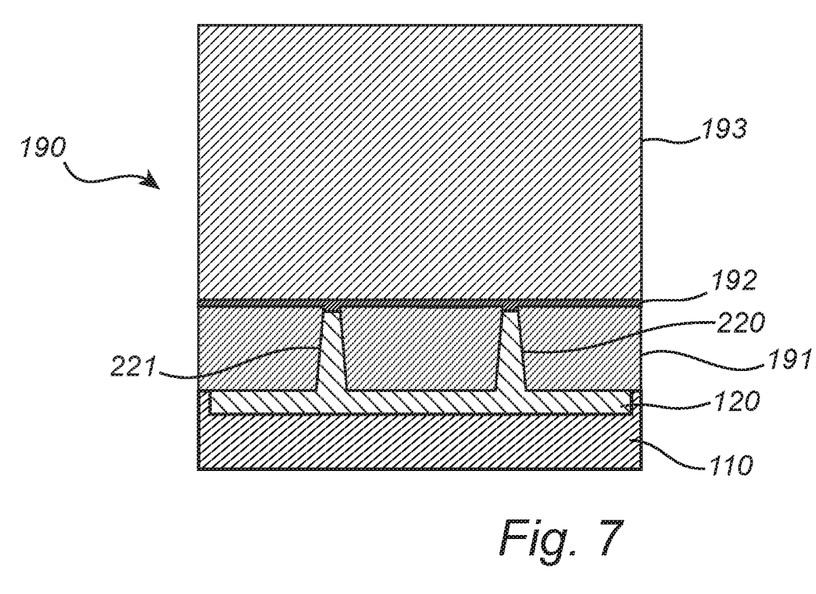
FIG. 7 illustrates a second method for forming an HBT device and shows a portion of the substrate 110 comprising a doped region 120 formed in a group IV semiconductor layer of the substrate 110. The doped region 120 comprises a first semiconductor fin 220.

FIG. 7 shows a portion of the substrate 110 comprising a doped region 120 formed in a group IV semiconductor layer of the substrate 110. The doped region 120 comprises a first semiconductor fin 220. As will be further described below, a III-V body/III-V sub-collector may be formed at the position of the first fin 220. The doped region 120 further comprises a second semiconductor fin 221 extending in parallel to the first fin 220. As will be further described below, the second fin 221 may be used as a sub-collector contact portion.

The first fin 220 forms part of the doped region 120 and may be integrally formed therewith. The first fin 220 and the doped region 120 may accordingly be formed of a same group IV semiconductor and have a same dopant dose. This applies correspondingly to the second fin 221.

The fins 220, 221 may be formed in a conventional manner, e.g. by patterning fins in the group IV semiconductor layer of the substrate 110. Single patterning ("litho-etch"), or multiple-patterning techniques (e.g. self-aligned double patterning, SADP, or self-aligned quadruple patterning, SAQP) may be used depending on the desired fin dimensions and pitches. The fins 220, 221 and an underlying region of the group IV semiconductor layer may subsequently be doped to define the doped region 120, for instance by ion implantation or diffusion doping. Alternatively or additionally, the fins 220, 221 may be patterned in a pre-doped region of the group IV semiconductor layer.

The fins may be patterned and doped in parallel with forming active device regions in a CMOS region (as discussed above in connection with FIGS. 1-3), which for instance also may comprise fin patterning. Alternatively, the fin formation and/or doping may be performed after completing CMOS processing.

As shown in FIG. 7, the doped region 120 comprising the fins 220, 221 may be covered by an insulating layer 190. The insulating layer 190 may as shown comprise a stack of layers such as a lower insulating layer portion 191, an etch stop layer 192 and an upper insulating layer portion 193. The lower insulating layer portion 191 may embed the fins 220, 221. The etch stop layer 192 may be formed on an upper surface of the lower insulating layer portion 191 and on respective upper surfaces of the fins 220, 221. The upper insulating layer portion 193 may be formed on the etch stop layer 192. The lower and upper insulating layer portions 191, 193 may be formed of different or a same insulating material, such as those discussed in connection with FIG. 1 above. The etch stop layer 192 may be a nitride-based layer or some other insulating material, such as $Al_2O_3$, providing an etch contrast with respect to the material of the upper insulating layer portion 191. It should however be noted that the etch stop layer 192 is optional and that the insulating layer 190 also may be formed as a single layer of a uniform composition.

Figure 8:
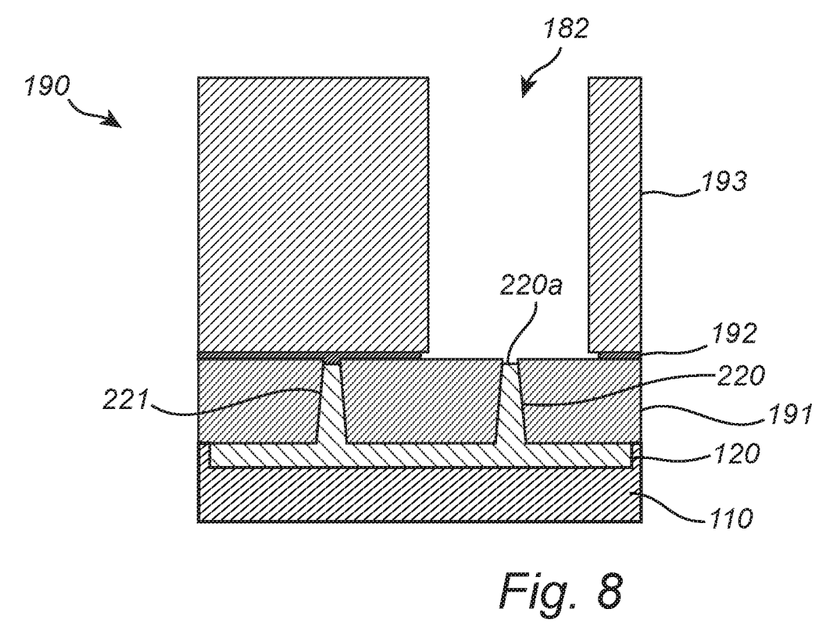
FIG. 8 illustrates a second method for forming an HBT device and shows the insulating layer 190 may be opened to expose an upper surface 220a of the fin 220.

In FIG. 8, the insulating layer 190 may be opened to expose an upper surface 220a of the fin 220. Accordingly an upper aperture portion 184 may be formed in the insulating layer 190. More specifically, the upper aperture portion 184 may extend through the upper insulating layer portion 193 and through the etch stop layer 192. The aperture 180 may be formed in the shape of a trench. The trench may have a longitudinal extension to expose the upper surface 220a of the first fin 220 along at least part of its length. Especially, the trench may have a longitudinal extension to expose the upper surface 220a of the first fin 220 along its entire length. In other words, the trench/upper aperture portion 184 may be coextensive with the fin 220 in a horizontal plane.

The upper aperture portion 184 may be formed by etching the insulating layer 190 through an opening defined in an etch mask (not shown), for instance a photoresist etch mask. Any conventional wet or dry etching process suitable for etching the insulating layer 190 (or more specifically the upper insulating layer portion 193 thereof) may be used. The insulating layer 190 may be etched until the etch stop layer 192 is exposed. The upper surface of the fin 220 may then be exposed by a short additional etch step opening the etch stop layer 192. In absence of an etch stop layer 192, the insulating layer 190 may be etched in one step until the upper surface 220a of the first fin 220 is exposed. The etch mask may be removed subsequent to forming the upper aperture portion 184 or subsequent to In FIG. 9, the upper surface 220a of the fin 220 may be etched back. Accordingly, a lower aperture portion 182 may be formed in the insulating layer 190, thereby completing the formation of the aperture 180, comprising the lower and upper aperture portions 182, 184. More specifically, the lower aperture portion 182 may extend through the lower insulating layer portion 191. A bottom surface of the lower aperture portion 182 (and hence of the aperture 180) may be formed by the etched-back surface portion 222. The fin 220 may be etched back along the length of the upper surface 220a exposed by the upper aperture portion 184. Provided the upper aperture portion 184 is coextensive with the fin 220, the fin 220 may be etched back along its entire length. The etch back of the fin 220 may be complete or partial. Advantageously, the fin 220 may be etched back such that a level of the etched-back surface portion 222 coincides with or is formed below a level of a bottom surface of the insulating layer 190 (i.e. of the lower insulating layer portion 191).

Figure 9:
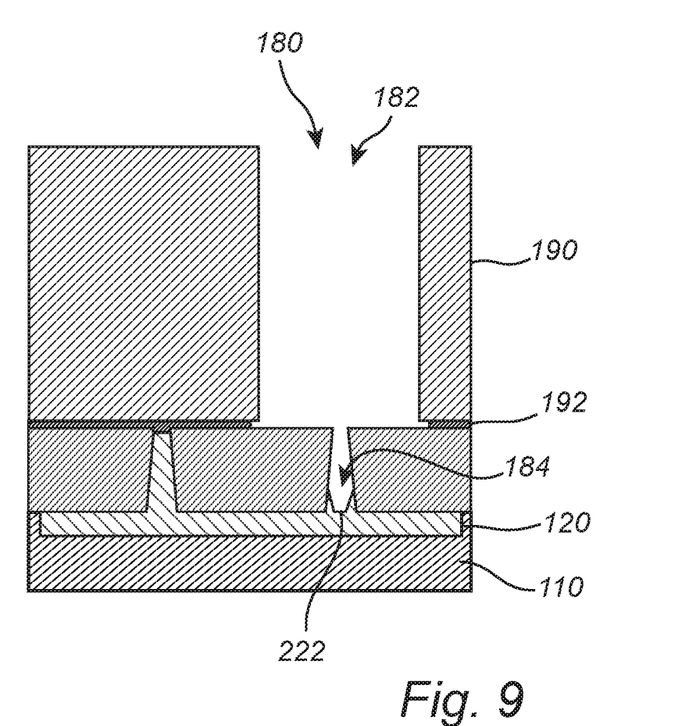
FIG. 9 illustrates a second method for forming an HBT device and shows the upper surface 220a of the fin 220 may be etched back.

Any conventional wet or dry etching process suitable for etching the group IV semiconductor material of the fin 220 may be used. For instance, a wet etch with KOH or TMAH or a fluorine-based dry etch.

Figure 10:
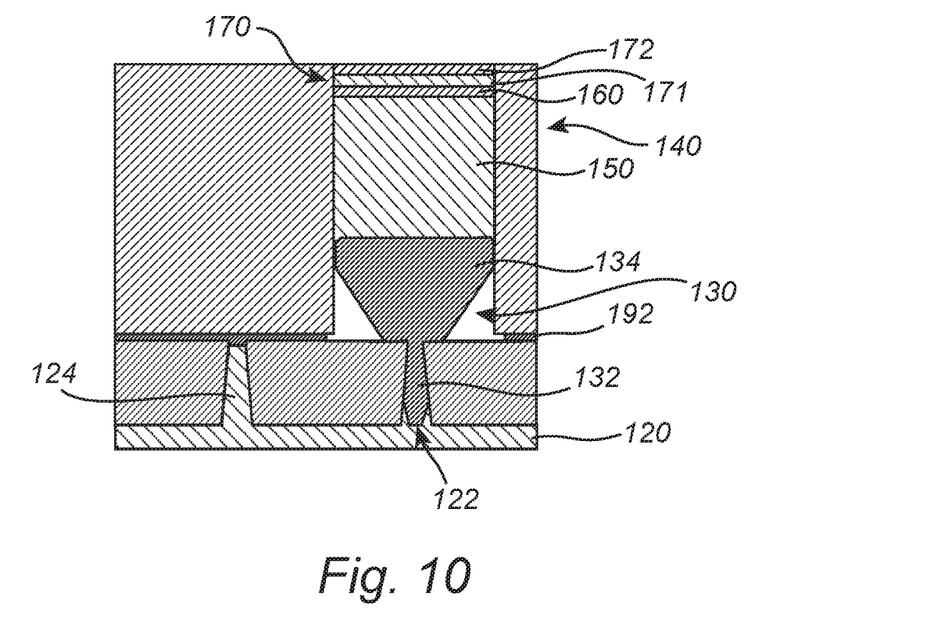
FIG. 10 illustrates a second method for forming an HBT device and shows an epitaxially grown III-V semiconductor body 130 being formed on the etched-back surface portion 222 of the doped region 120.

In FIG. 10, an epitaxially grown III-V semiconductor body 130 may be formed on the etched-back surface portion 222 of the doped region 120. As may be seen by comparing FIGS. 9 and 10, the III-V body 130 comprises a lower body portion 132 formed in the lower aperture portion 182 and an upper body portion 134 formed in the upper aperture portion 184. Since the upper aperture portion 184 may be wider than the lower aperture portion 132, the upper aperture portion 184 may accommodate formation of a wider upper body portion 134 while the lower aperture portion 182 may accommodate formation of a more narrow lower body portion 132. More specifically, the lower aperture portion 182 may restrict a horizontal component of the growth front while the growth front of the epitaxy of the III-V body 130 may be inside the lower aperture portion 182. Once the growth front enters the upper aperture portion 182, the horizontal component of the growth front may be unobstructed wherein the upper body portion 134 may be allowed to gradually widen until, eventually, meeting the sidewalls of the upper aperture portion 184.

According to an advantageous approach, the III-V semiconductor body 130, more specifically the lower portion 132 thereof, may be grown using aspect ratio trapping (ART). As semiconductor fins typically may be formed as high aspect ratio structures, it may be understood that the lower aperture portion 182 (formed by etching back the upper surface of the first fin 220) may be formed as a high aspect ratio aperture/ trench. By a high aspect ratio of a feature (such as the fin or the aperture) is hereby meant that a ratio of a height dimension of the feature to a width dimension of the feature is at least 1.5:1. As per se is known to the skilled person, ART allows trapping of dislocations in the epitaxially grown III-V material. The dislocations may originate from the lattice mismatch between the III-V and the group IV semiconductors. The density of dislocations in the III-V body 130 may accordingly gradually be reduced along an upward direction/growth direction.

As shown in FIG. 9 and FIG. 10, the etched-back surface portion 222 may comprise a pair of facets. The etched-back surface portion 222 may thus form a V-shaped groove. More generally, the shape of the etched-back surface portion 222 may depend on the crystal structure of the group IV semiconductor material and the type of etching process. The faceted shape schematically indicated in FIGS. 9 and 10 may for instance be [111] planes of] Si. For instance, such facets may be achieved by an anisotropic wet etch using for instance TMAH. The presence of facets, such as those formed by Si [111] planes may improve the efficiency of the dislocation trapping during ART. This may be explained by the facets imparting the growth fronts for the III-V material with a horizontal component. The growth fronts may accordingly be reflected by the sidewalls of the lower aperture portion 182 one or more times, depending on the aspect ratio.

In FIG. 10, a III-V layer stack 140 comprising an epitaxial collector layer 150, an epitaxial base layer 160 and an epitaxial emitter layer 170 may be formed on an upper surface of the III-V body 130, in the upper aperture portion 184.

For a discussion concerning material choices, epitaxy processes, types of doping techniques and dopant doses for the III-V body 130 and the III-V layer stack 140, reference may be made to the above discussion in connection with the first method. As shown in FIG. 10, the emitter layer 170 may comprise a number of sub-layers, such as layers 171, 172.

Figure 11:
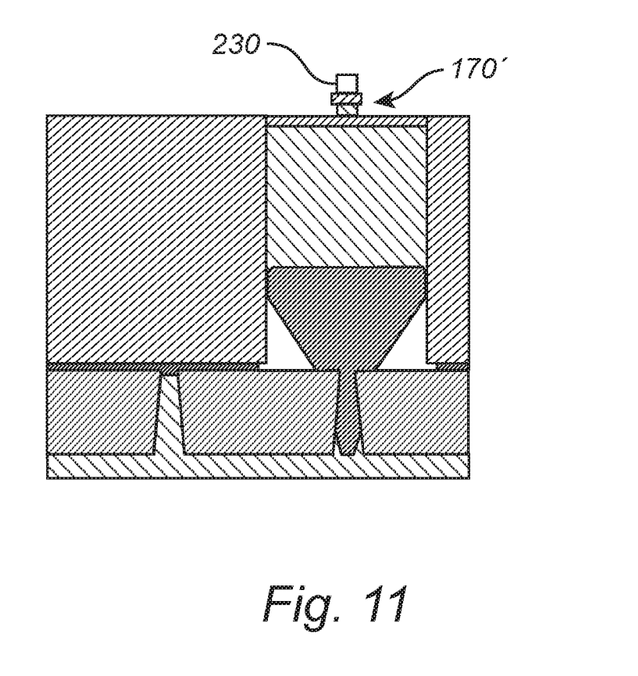
FIG. 11 illustrates a second method for forming an HBT device and shows the emitter layer 170 being patterned to expose an upper surface of the base layer 160 on opposite sides of the patterned emitter layer 170'.

In FIG. 11, the emitter layer 170 may be patterned to expose an upper surface of the base layer 160 on opposite sides of the patterned emitter layer 170'. An etch mask 230 may be formed on the emitter layer 170 wherein the portions of the base layer 160 exposed by the mask 230 may be etched. The etch mask 230 may be a hard mask (such as a nitride-based material or some other conventionally used hard mask material) patterned by lithography and etching to cover a desired portion of the emitter layer 170. The emitter layer 170 may, for instance, be etched using a chlorine-based reactive ion etch. The etch mask 230 may remain on the patterned emitter layer 170' to serve as a capping layer 230 thereof.

Figure 12:
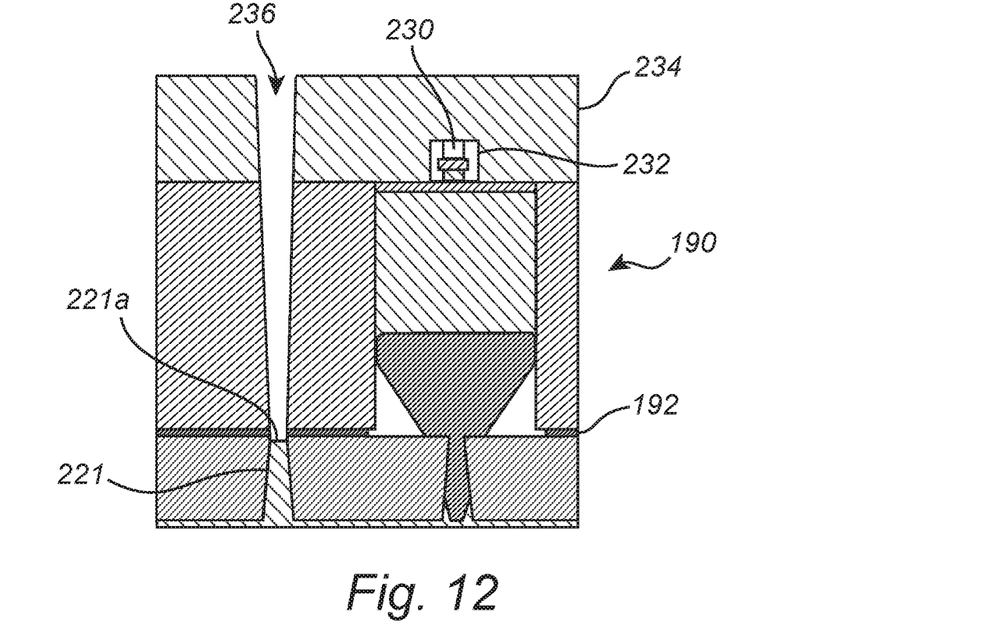
FIG. 12 illustrates a second method for forming an HBT device and shows the patterned emitter layer 170' being provided with sidewall spacers 232. The patterned emitter layer 170' may be encapsulated by the sidewall spacers 232 and the capping layer 230.

In FIG. 12, the patterned emitter layer 170' may be provided with sidewall spacers 232. The patterned emitter layer 170' may accordingly be encapsulated by the sidewall spacers 232 and the capping layer 230. The sidewall spacers 232 may, for instance, be formed by a nitride material, such as SiN. The sidewall spacers 232 may be formed in a sidewall spacer deposition approach. A spacer layer may be conformally deposited, e.g. by atomic layer deposition (ALD), to cover the patterned emitter layer 170' and the capping layer 230. Spacer layer portions deposited on horizontally oriented surfaces may subsequently be removed using a vertical anisotropic etch step, such that spacer layer portions deposited on vertically oriented surfaces may be preserved to form the sidewall spacers 232.

Subsequent to forming the sidewall spacers 232, a further insulating layer 234 may be formed to embed the encapsulated patterned emitter layer 170'. Although indicated as a separate layer in FIG. 12, it should be noted that the further insulating layer 234 may be formed by a same material as the insulating layer 190 or, as the case may be, the upper insulating layer portion 194 thereof.

A sub-collector contact aperture 236 may be formed by opening the insulating layers 234, 190 above the second fin 221. As mentioned above, the second fin 221 may form a sub-collector contact portion of the doped region 120. The contact aperture 236 may expose an upper surface 221a of the second fin/the contact sub-region 221. The contact aperture 236 may be formed by etching through the insulating layers 234, 190 (and, if present, the etch stop layer 192) via an opening defined in an etch mask (not shown), for instance a photoresist etch mask or a hard mask. Due to the comparably high aspect ratio of the contact aperture 236, anisotropic dry etching, such as deep reactive ion etching (DRIE), may be beneficial to use.

Figure 13:
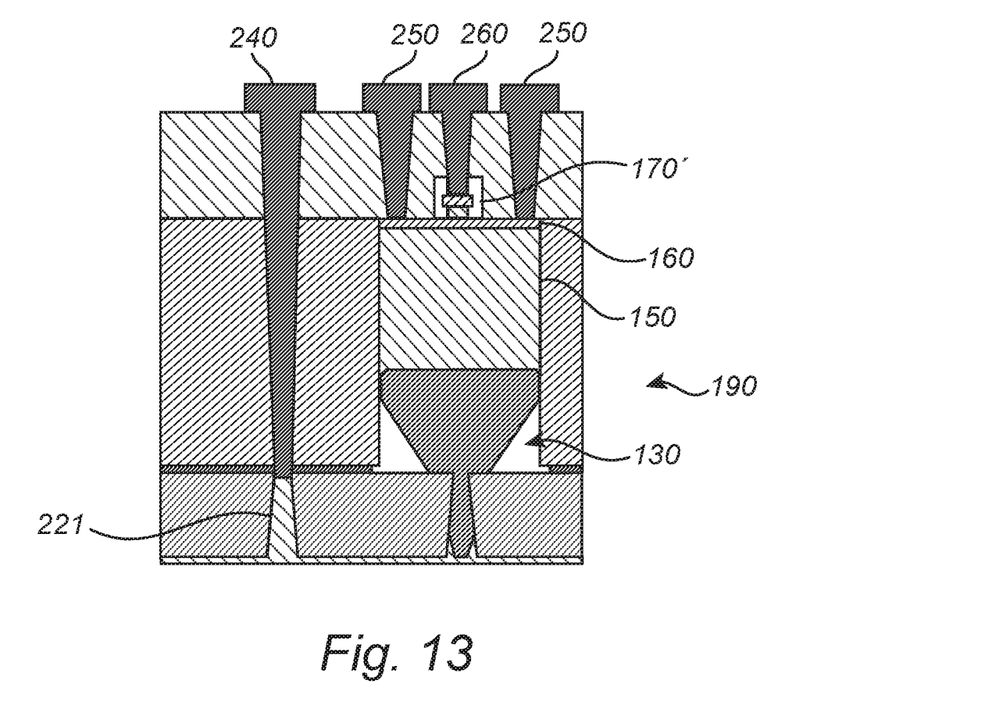
FIG. 13 illustrates a second method for forming an HBT device and shows a sub-collector contact 240 being formed in the contact aperture 236, in contact with the upper surface of the second fin 221. The sub-collector contact 126 may be formed by depositing one or more metals in the contact aperture 236.

In FIG. 13, a sub-collector contact 240 may be formed in the contact aperture 236, in contact with the upper surface of the second fin 221. The sub-collector contact 126 may be formed by depositing one or more metals in the contact aperture 236.

As further shown in FIG. 13, a pair of base contacts 250 may be formed in contact with the base layer 160. An emitter contact 260 may be formed in contact with the emitter layer 170'. These further contacts 250, 260 may be formed in respective contact apertures formed in the insulating layer 234 in a manner similar to the sub-collector contact aperture 236. The formation of the aperture for the emitter contact 260 may comprise, as a final step, opening of the capping layer 270 to expose the patterned emitter layer 170'.

The contact apertures, including the sub-collector contact aperture 236, may be formed first and then simultaneously filled by depositing one or more metals. The one or more metals may be deposited to cover the insulating layer 234 and thereafter be patterned into respective contacts.

The resulting HBT device comprises a group IV sub-collector part extending from the sub-collector contact surface 221a, vertically through the second fin 221, horizontally from a base of the second fin 221 to the heterojunction between the doped region 120 and the III-V body 130, which forms the group III-V sub-collector part. It should however be noted that it also is possible to form the sub-collector contact on a non-fin region of the doped region 120.

Figure 14:
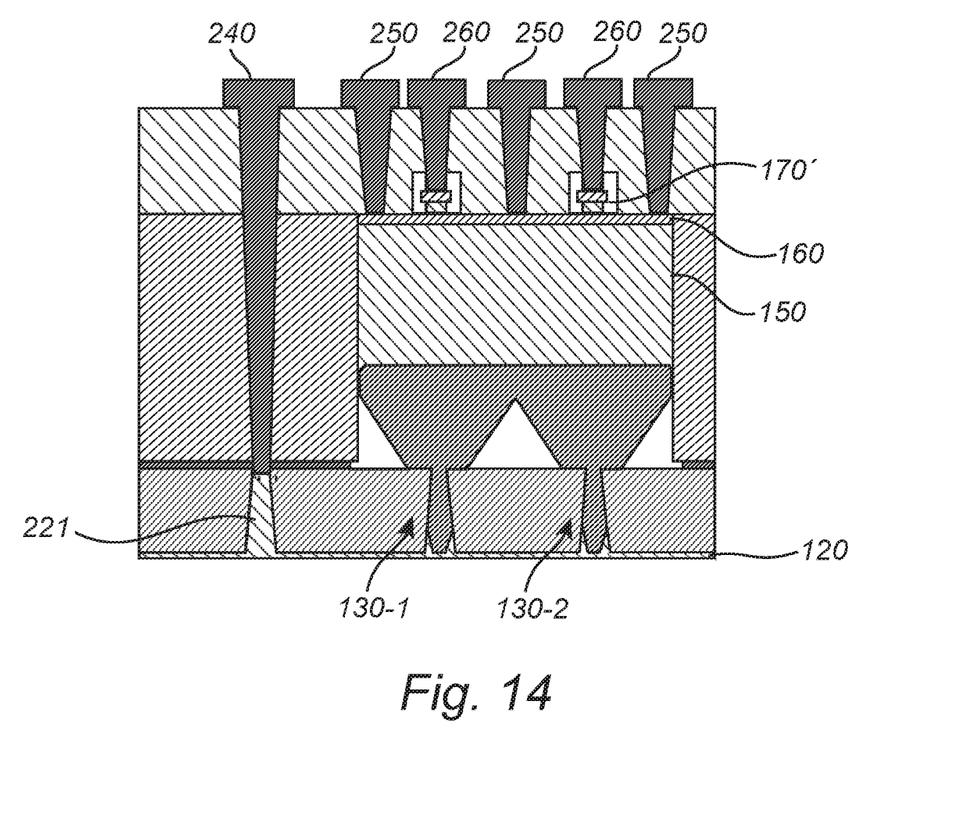
FIG. 14 illustrates two HBT devices formed side-by-side and shows an alternative device structure wherein two HBT devices have been formed side-by-side, and having a shared group IV sub-collector. The device structure may be formed in a similar fashion as the device shown in FIG. 13, however by growing a respective III-V body 130-1, 130-2 in two adjacent apertures, formed e.g. by etching two adjacent semiconductor fins.

FIG. 14 shows an alternative device structure wherein two HBT devices have been formed side-by-side, and having a shared group IV sub-collector. The device structure may be formed in a similar fashion as the device shown in FIG. 13, however by growing a respective III-V body 130-1, 130-2 in two adjacent apertures, formed e.g. by etching two adjacent semiconductor fins. This approach may be applied to form any number of HBTs on a common group IV sub-collector.

Figure 15:
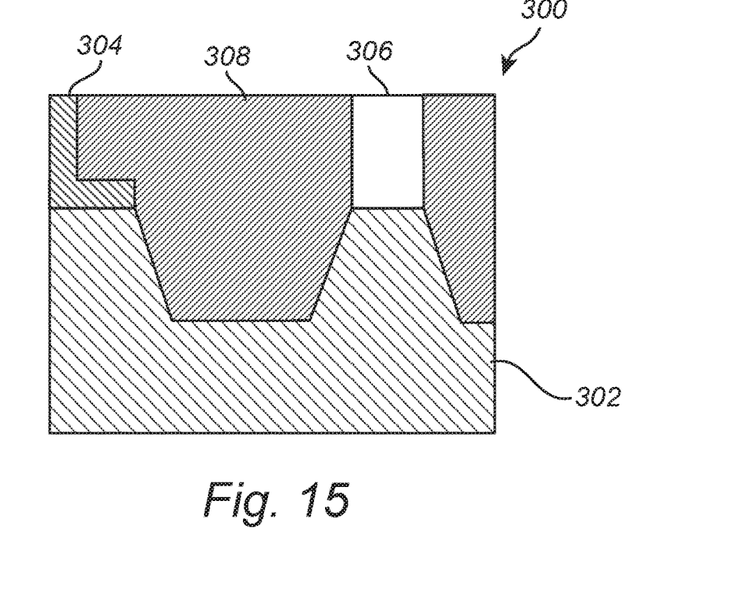
FIG. 15 shows a semiconductor structure for the semiconductor structure
Figure 16:
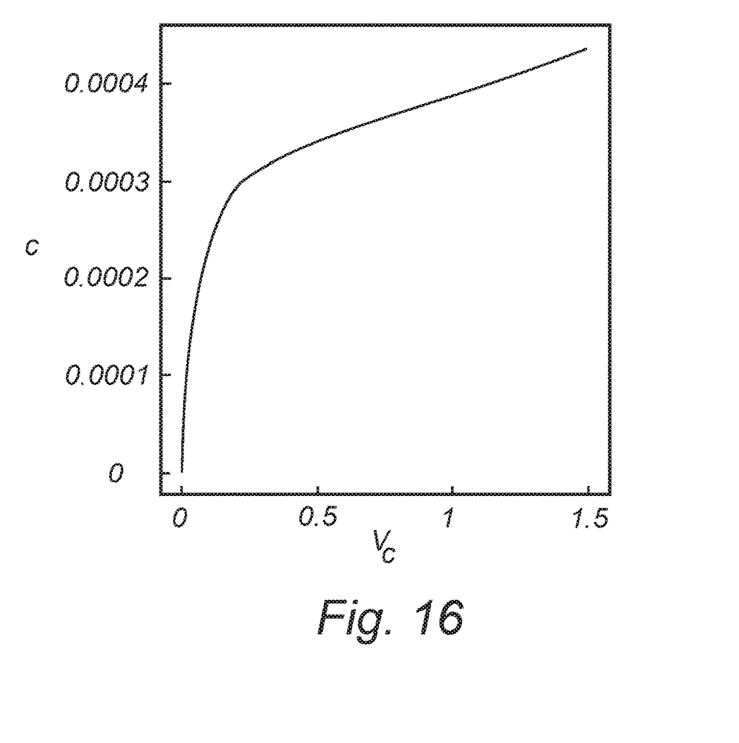
FIG. 16 show a simulated I-V curve for the semiconductor structure.

FIG. 16 show simulated I-V curve for a semiconductor structure 300 shown in FIG. 15 which comprises a Si substrate 302 with an n-type dopant dose of 1E20 at/cm$^3$ and a GaAs body 304 with an n-type dopant dose of 1E17 at/cm$^3$. The current path extends between the metal contact 306 and the GaAs body 304, via the Si substrate 302. The substrate 302 is covered with an insulating layer 308. Since the junction between the sub-collectors 302, 304 does not show rectifying behavior it demonstrates that a part of the sub-collector may be formed in a doped region of a Si substrate layer without any appreciable loss in device performance (i.e. without increased series resistance).

In the above discussion, the disclosure has mainly been described with reference to a limited number of examples. However, as is readily appreciated by a person skilled in the art, other examples than the ones disclosed above are equally possible within the scope of the disclosure, as defined by the appended claims.

What is claimed:

1. A method for forming a heterojunction bipolar transistor, the method comprising:
   forming a doped region in a group IV semiconductor layer of a substrate;
      forming an epitaxially grown III-V semiconductor body on an etched-back surface portion of the doped region, the body extending from the etched-back surface portion and protruding vertically above the doped region, wherein the doped region and the body forms a first sub-collector part and a second sub-collector part, respectively, wherein the etched-back surface portion of the doped region is exposed by an aperture extending through an insulating layer formed on the doped region, wherein the doped region comprises a first semiconductor fin, the first semiconductor fin having an upper surface defining an upper surface of the doped region, the doped region formed by:
         embedding the first semiconductor fin in the insulating layer;
         opening the insulating layer to expose the upper surface of the first semiconductor fin, thereby forming an upper portion of the aperture; and
         etching back the upper surface of the first semiconductor fin, thereby forming a lower portion of the aperture and the etched-back surface Portion of the doped region; and
   forming an epitaxially grown Ill-V semiconductor layer stack on the body, the layer tack comprising a collector, a base and an emitter.

2. The method according to claim 1, further comprising forming a sub-collector contact in contact with a contact sub-region of the doped region, horizontally spaced apart from the surface portion.

3. The method according to claim 1, wherein forming the body comprises epitaxially growing a lower portion of the body in the lower portion of the aperture and an upper portion of the body in the upper portion of the aperture, and wherein the upper portion of the aperture is wider than the lower portion of the aperture.

4. The method according to claim 3, wherein of the doped region comprises a second semiconductor fin horizontally spaced apart from the first semiconductor fin, and the method further comprises forming a sub-collector contact in contact with an upper surface of the second semiconductor fin.

5. The method according to claim 1, wherein of the doped region comprises a second semiconductor fin horizontally spaced apart from the first semiconductor fin, and the method further comprises forming a sub-collector contact in contact with an upper surface of the second semiconductor fin.

6. The method according to claim 1, wherein a dopant dose of the doped region ranges from 5E18 to 1E20 at/cm$^3$.

7. The method according to claim 1; wherein a dopant dose of the III-V semiconductor body is at least 1E17 at/cm$^3$.

8. The method according to claim 1, wherein the second sub-collector part, the collector, the base, and the emitter comprise gallium arsenide.

* * * * *